United States Patent [19]

Worns et al.

[11] Patent Number: 4,686,172

[45] Date of Patent: Aug. 11, 1987

[54] PHOTOSENSITIVE ELASTOMERIC COMPOSITION FOR FLEXOGRAPHIC PRINTING PLATES HAVING IMPROVED SOFTNESS

[75] Inventors: John R. Worns, Mishawaka, Ind.; Milton Farber, Bethany, Conn.; David T. Hughes, Shropshire, England

[73] Assignees: Uniroyal Plastics Co., Inc., Mishawaka, Ind.; Royalite Plastics Limited, Newbridge, Scotland

[21] Appl. No.: 756,861

[22] Filed: Jul. 18, 1985

[51] Int. Cl.$^4$ .................................................. G03C 1/71
[52] U.S. Cl. ..................................... 430/286; 430/287; 430/306; 522/110
[58] Field of Search ................ 522/110; 430/286, 287, 430/306

[56] References Cited

U.S. PATENT DOCUMENTS

| | | | |
|---|---|---|---|
| 3,787,212 | 1/1974 | Heimsch | 96/35.1 |
| 4,045,231 | 8/1977 | Toda et al. | 430/306 X |
| 4,177,074 | 12/1974 | Proskow | 430/286 |
| 4,272,608 | 6/1981 | Proskow | 430/288 |
| 4,323,636 | 4/1982 | Chen | 430/271 |
| 4,394,435 | 7/1983 | Farber et al. | 430/287 |
| 4,517,279 | 5/1985 | Worns | 430/286 |

FOREIGN PATENT DOCUMENTS 1358062 6/1974 United Kingdom .

*Primary Examiner*—John E. Kittle
*Assistant Examiner*—Cynthia Hamilton
*Attorney, Agent, or Firm*—Pennie & Edmonds

[57] ABSTRACT

A photosensitive elastomeric composition which comprises a high molecular weight elastomeric diene polymer having a number average molecular weight ($\overline{M}n$) of about 30,000 to 125,000, and a Mooney viscosity (ML-4 at 100° C.) of 35 or higher; a low molecular weight diene polymer having a number average molecular weight of about 1,000 to 25,000; a photopolymerizable, ethylenically unsaturated cross-linking agent; and an addition polymerization initiator activatable by actinic radiation.

7 Claims, No Drawings

PHOTOSENSITIVE ELASTOMERIC COMPOSITION FOR FLEXOGRAPHIC PRINTING PLATES HAVING IMPROVED SOFTNESS

FIELD OF THE INVENTION

This invention relates to elastomeric compositions comprising a high molecular weight, elastomeric diene polymer and a low molecular weight diene polymer, useful in photosensitive flexographic printing plates.

The flexible photopolymer printing plates produced utilizing the compositions of the present invention may be processed with solvents or blends of halogenated hydrocarbons and alcohols. The plates also exhibit solvent resistance to a wide variety of printing inks, including water, alcohol, and ketone or ester based inks. The compositions also exhibit good abrasion resistance, flexibility and clarity.

BACKGROUND OF INVENTION

British Pat. No. 1,358,062 discloses photosensitive compositions consisting of a nitrile rubber with an addition photopolymerizable tri- or tetra-unsaturated ester derived from acrylic or methacrylic acid and an addition polymerization initiator activatable by actinic radiation.

U.S. Pat. No. 3,825,430 discloses a photosensitive composition containing a continuous phase of a light sensitive organic material and a discontinuous phase of a finely divided, elastomeric organic compound uniformly distributed through the continuous phase, i.e., a carboxyl containing, high molecular weight butadiene-acrylonitrile copolymer.

U.S. Pat. No. 4,177,074 discloses a photosensitive composition containing a high molecular weight butadiene-acrylonitrile copolymer which contains carboxyl groups and a low molecular weight butadiene polymer which may or may not contain carboxyl groups and an ethylenically unsaturated monomer, and a free-radical generating system. This composition has use in flexographic printing plates.

U.S. Pat. No. 4,272,608 discloses photosensitive elastomeric compositions comprising a high molecular weight carboxylated butadiene-acrylonitrile copolymer in which at least 25% of the carboxyl groups are neutralized with a metal cation of Groups IIA and IIB of the periodic table and an ethylenically unsaturated monomer and a free radical generating system.

U.S. Pat. No. 4,323,636 discloses that photosensitive elastomeric compositions comprising at least 30% by weight of a solvent-soluble, thermoplastic, elastomeric block copolymer, a non-gaseous ethylenically unsaturated compound, and an addition polymerization initiator activatable by actinic light are useful in flexographic printing plates.

SUMMARY OF THE INVENTION

The present invention relates to a flexible photopolymer printing plate composition comprising a blend of:
(A) a high molecular weight elastomeric diene polymer having a number average molecular weight ($\overline{M}n$) of about 30,000 to 125,000 and a Mooney viscosity (ML-4 at 100° C.) of 35 or higher;
(B) low molecular weight diene polymer having a number average molecular weight of about 1,000 to 25,000;
(C) a photopolymerizable, ethylenically unsaturated cross-linking agent compatible with polymers (A) and (B); and
(D) an addition polymerization initiator activatable by actinic radiation.

This invention provides photosensitive materials for producing flexographic printing plates with the advantages of increased production rates, reduced costs, and labor savings over conventional platemaking procedures. These blends are usually homogeneous and have very good ink compatibility. These compositions also show exceptional sensitivity (high cure rate) requiring only relatively short exposure to actinic radiation to reproduce finely detailed images and exhibit very little shoulder build-up. Most importantly, solid flexographic printing plates have difficulty printing evenly on rough or corrugated surfaces because of the inherent variations of printing pressures caused by the peaks and troughs on the surface. Attempts to solve this non-uniform ink laydown problem caused by the uneven surface have utilized among other adaptations such extensive modifications as the incorporation between the photosensitive layer and the supporting substrate of a foamed, resilient material. Albeit, it is relatively easy to realize a "cushion" effect by merely providing low cure to the photosensitive compositions and achieve a low Durometer composition, i.e. a "soft" material, this approach has resulted in relief plates with very poor image retention.

The exceptional softness of the solid compositions of this invention which cure fully and rapidly, provides greater flexibility in plate pressure or pressure variations without leading to image distortions than heretofore known compositions in this art. This combination of characteristics is unusual and printing plates made from such compositions are of considerable commercial value.

DETAILED DESCRIPTION OF THE INVENTION

The compositions of this invention comprise (A) an elastomeric diene polymer having a number average molecular weight of 30,000 to 125,000, preferably 30,000 to 100,000 and most preferably 35,000 to 75,000, with a Mooney viscosity (ML-4 at 100° C.) of 35 or higher, preferably 35 to 60. Such elastomeric diene polymers include elastomeric polybutadienes, polyisoprenes, copolymers of butadiene or isoprene with at least one copolymerizable ethylenically unsaturated monomer having the formula $CH_2CRR^1$, wherein R is hydrogen or methyl and $R^1$ is phenyl or alkylphenyl. Typical polymers include cis-polybutadiene, cis-polyisoprene, poly(butadiene-styrene), poly(butadiene-alpha-methylstyrene), as well as thermoplastic elastomeric block copolymers having the structure AB or ABA whereby A represents polystyrene, poly(alpha-methylstyrene) or poly(vinyltoluene) sequences and B represents polybutadiene or polyisoprene sequences, it being understood that AB-type block copolymers also include so-called "tapered" diblock copolymers as described in U.S. Pat. No. 3,317,918 (Foster).

Generally, the AB or ABA block copolymers contain 3.5–35 percent non-elastomeric sequences and 65–96.5 percent of elastomeric sequence; preferably the A sequences constitute 10–30 percent and the B sequence the difference: i.e. 70–90 percent, of such copolymers.

The composition blends of this invention further comprise (B) a low molecular weight diene polymer compatible with (A), including polybutadiene and polyisoprene having a number average molecular weight of 1,000 to 25,000, preferably 5,000 to 25,000, most preferably 8,000 to 20,000. These low molecular weight diene polymers include depolymerized polybutadiene, polyisoprene, depolymerized natural rubber, and the like.

The (A)/B) weight ratio may be 95/5 to 50/50, preferably 90/10 to 70/30, most preferably 85/15 to 5/25.

Furthermore, the photosensitive compositions of this invention comprise ethylenicaly unsaturated crosslinking agents (C) including unsaturated esters of polyols, particularly such esters with alpha-methylene carboxylic acids, e.g. ethylene glycol diacrylate, diethylene glycol diacrylate, glycerol diacrylate, glycerol triacrylate, mannitol polyacrylate, sorbitol polyacrylate, ethylene glycol dimethacrylate, 1,3-propanediol dimethacrylate, 1,3,4-butanetriol trimethacrylate, 1,4-butanediol diacrylate or dimethacrylate, 1,4-cyclohexanediol diacrylate, 1,4-benzenediol dimethacrylate, isosorbidene diacrylate, pentaerythritol di-, tri- and tetramethacrylate, dipentaerythritol polyacrylate, dipentaerythritol polyacrylate, pentaerythritol di, tri- and tetra-acrylates, 1,3-propanediol diacrylate, 1,6-hexanediol diacrylate or dimethacrylate, 1,5-pentanediol dimethacrylate, trimethylolpropane triacrylate, the bisacrylates and methacrylates of polyethylene glycols of molecular weight 200 to 4000, unsaturated amides, particularly those of the alpha-methylene carboxylic acids and especially those of alpha, omega-diamines and oxygen-interrupted omega-diamines such as methylene bisacrylamide, methylene bismethacrylamide, ethylene bismethacrylamide, 1,6-mexamethylene bisacrylamide, diethylene triamine, trismethacrylamide, 1,2-di(gamma-methacrylamidopropoxy)ethane, beta-methacrylaminoethyl methyacrylate, N-(beta-hydroxyethyl)-2-(methacrylamido) ethyl acrylate and N,N-bis(beta-methacryloxethyl)acrylamide; vinyl esters such as divinyl succinate, divinyl adipate, divinyl phthalate, divinyl terepthalate, divinyl benzene-1,3-disulfonate, divinyl butane-1,4-disulfonate and unsaturated aldehydes, such as sorbaldehyde (hexadienal). Preferred addition polymerizable crosslinking agents are the esters and amides of alpha-methylene carboxylic acids and substituted carboxylic acids with polyols and polyamines wherein the molecular chain between the hydroxyls and amino groups is solely carbon or oxygen-interrupted carbon.

The amount of unsaturated crosslinking agent added should be about 2 to 40 parts by weight preferably about 5 to 25 parts by weight based on 100 parts of the elastomer content. The exact amount will vary for best results depending on the particular composition used.

The most preferred unsaturated crosslinking agents are 1,4-hexandiol diacrylate, 1,4-hexanediol dimethylacrylate, trimethylolpropane triacrylate and pentaerythritol triacrylate. The preferred compositions are those in which the high molecular weight copolymers are compatible with the unsaturated compounds to form clear, non-light scattering compositions in layers up to 0.250 inch (ca. 6.4 mm) thick.

Another component (D) of the photosensitive composition of this invention is an addition polymerization and/or crosslinking initiator activatable by actinic radiation and thermally inactive at or below 185° C. Such initiators include aromatic ketones such as benzophenone and substituted benzophenones, the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Such suitable initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-napthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone, alpha-sulfonic acid, 3-chloro-2-methylanthraquinone, retenequinone, 7,8,9,10-tetrahydronaphthacenequinone, and 1,2,3,4-tetrahydrobenz-alpha-anthracene-7,12-dione. Other photoinitiators which are useful for the purpose of this invention are described in U.S. Pat. No. 2,760,863 and include vicinal ketaldonyl compounds such as diacetyl benzil, etc., alpha-ketaldonyl alcohols, such as benzoin, pivaloin, etc. acyloin ethers, e.g. benzoin methyl and ethyl ethers, etc., alpha-hydrocarbon substituted aromatic acyloins, including alpha-methylbenzoin, alpha-allylbenzoin and alpha-phenylbenzoin and 2,2 dialkoxy-2-phenylacetophenone.

The amount of photoinitiator added should be from about 0.01 to 10 parts by weight based on 100 parts of the total elastomer, the preferred range being from about 0.2 to 4.

The photosensitive composition can be prepared by mixing the components, i.e. (A) the high molecular weight diene elastomer, (B) the low molecular weight diene polymer (C) the compatible ethylenically unsaturated crosslinking agent, and (D) the free-radical generating system to a preferably homogeneous blend either by solvent blending in suitable solvents such as chlorinated hydrocarbons, e.g., trichloroethylene, trichloroethane and chlorotoluene: ketones, e.g., methyl ethyl ketone, diethyl ketone, and methyl isobutyl ketone; aromatic hydrocarbons, e.g., toluene and tetrahydrofuran or by open milling or by internally mixing for a time long enough to blend the ingredients thoroughly, preferably homogeneously.

The non-light scattering compositions are then formed into sheets in any desired manner in thicknesses of from about 0.0005 to 0.250 inch (0.0013–0.64 cm). Such methods are, for example, solvent-casting, hot pressing, calendering or extrusion at room temperature or at elevated temperature. The sheet may be supported during forming by a suitable supporting substrate or the sheet may be applied to a supporting substrate after forming. The supporting substrate can be any natural or synthetic support which exists in a flexible or rigid film or sheet form. Commonly used supports for use by this composition in flexographic printing include metal sheets such as steel or tin coated steel and plastic films such as polyester or polyamide. The preferred supporting substrates are dimensionally stable and resistant to the washout solutions.

As these are photo-activated systems, it is necessary to protect the above mentioned sheets from surface contamination by dirt and dust during storage before being exposed and washed into a finished relief imaged element. This is accomplished by lamination or application of a flexible protective cover sheet to the side of the element opposite that of the substrate. As these elements can be tacky, it is also desirable to apply a release film to the surface of the element before application of the protective cover sheet. This release film may be about 0.0002 inch (0.0051 cm) thick flexible polymeric film. Typical polymeric materials are polyamide copolymers or vinyl acetate copolymers. Similarly familiar release agents may also be used for this purpose, e.g., silicone, fluorocarbons and waxes as long as they are transparent and do not interfere with exposure to actinic radiation. These release agents or films promote good intimate contact between the surface of the element opposite to the substrate and the image bearing negative or transparency applied to the element. This intimate contact is essential for accurate reproduction of the image on the element.

Relief printing plates are produced from the compositions of this invention from the above described sheets. The construction usually comprises a polyester substrate from 0.001 to 0.020 inch (0.025–0.051 mm) and preferably 0.004–0.006 inch (0.010–0.015 cm), adhered to a sheet of the composition of this invention from 0.005 to 0.250 inch (0.25–0.64 cm) thick coated with a ca. 0.0002 inch (0.005 mm) thick polyamide copolymer release film on the side opposite of the substrate. This polyamide film may be covered and adhered to a second polyester film (ca. 0.005 inch; 0.013 cm) which is a protective cover sheet. This construction is then exposed to actinic radiation through the substrate, if necessary depending on thickness, to crosslink via addition polymerization the non-relief backing area of the plate. This exposure will control the depth of relief produced in the plate (thin plates do not require this step). The plate is then turned over, and the protective cover sheet removed. Photographic negatives or transparencies or other image bearing media, with transparent and opaque areas used to produce the image, are laid in intimate contact with the polyamide release coated surface of the sheet of the composition of the invention. Good contact between the negative and release surface can be provided by a vacuum system that presses the negative against the sheet surface. This sandwich is then exposed to actinic radiation, e.g., ultraviolet radiation at a wavelength between 2500 Å and 5000 Å, with preferred being 3600 Å. On exposure, the transparent areas of the negative permit addition polymerization or crosslinking to take place. Exposure is of sufficient duration to crosslink the image to the substrate or the previously crosslinked sheet backing. Crosslinking will occur only in the exposed areas of the sheet (transparent areas of the negative) with no significant crosslinking occurring in the non-image, unexposed areas of the sheet (opaque areas of the negative).

Actinic radiation may be provided from any source such as, carbon arcs and high pressure mercury lamps. Preferred sources are very high output so-called blacklight fluorescent types due to their high ratio of ultraviolet to infrared output. Exposure times will vary, depending on the output of the lamps, distance from the lamp, the relief depth desired and the thickness of the plate. Exposure times may vary from a few seconds to several minutes.

On completion of the exposure, the negative is removed, and the exposed sheet is ready for development of the relief image by solvent wash. These wash systems remove the unexposed, uncrosslinked composition from the exposed sheet and do not adversely affect the exposed, crosslinked composition that forms the raised relief image.

Solvent wash may be accomplished as in the prior art with organic solvents such as 2-butanone, benzene, toluene, xylene, trichlorethane, trichlorethylene, tetrachlorethylene, methylchloroform, and solvent mixtures such as tetrachlorethylene with n-butanol.

The above composition has preferred utility in raised image printing processes such as letterpress, letterset and flexographic printing. Plates made in accordance with this invention have exceptional utility in rendering high quality images on very rough surfaces such as corrugated sheet or cardboard. However, the compositions may also have utility in other applications where image formation is utilized, such as photoresists, planographic plates, "silk screen" printing and stencils.

The following examples are illustrative of the present invention and are not intended as a limitation upon the scope thereof.

EXAMPLE 1

Polymer compositions were prepared using the following ingredients:

| Run No. | 1 | 2 | 3 | 4 |
|---|---|---|---|---|
| HMWP (1) | 90 | 83 | 80 | 70 |
| LMWP (2) | 10 | 17 | 20 | 30 |
| HDDA (3) | 5 | 5 | 5 | 5 |
| HDDM (4) | 3.3 | 3.3 | 3.3 | 3.3 |
| DMPA (5) | 1.7 | 1.7 | 1.7 | 1.7 |
| Processing Aids (6) | 6.0 | 6.0 | 6.0 | 6.0 |
| Antioxidant (7) | 0.06 | 0.06 | 0.06 | 0.06 |

Remarks
(1) High molecular weight polymer; styrene-isoprene-styrene block copolymer; specific gravity: 0.92; styrene/rubber ratio: 14/86; Shore A hardness: 37.
(2) Low molecular weight polymer; polyisoprene; number average molecular weight ($\bar{M}n$): 16,000.
(3) 1,6-hexanediol diacrylate; crosslinker.
(4) 1,6-hexanediol dimethacrylate; crosslinker.
(5) 2,2-dimethoxy-2-phenylacetophenone; initiator.
(6) Mixture of calcium stearate (2.8%), microcrystalline paraffin wax (27.6%) and vinylaromatic copolymer (69.6%, all by weight).
(7) Tetrakis[(3,5-di-t-butyl-4-hydroxphenyl)ethylcarbonyloxymethyl]methane.

Run Nos. 1–4 were prepared by adding to a sigma-blade type mixer first polymers HMWP and LMWP; blending for 7 minutes; charging initiators; and continuing the mixing for another 7 minutes. TMPTA and antioxidant were then added and mixed for 7 minutes. Next, processing aids were added. Blending was continued for 10 minutes, then the sides and blades of the blender were scraped down, and mixing was continued until the composition had reached 250° F. temperature, at which time the composition was discharged.

From these clear compositions, 0.160 inch thick flexible film was sheeted off a 2-roll mill at room temperature, and a 9×9 inch sheet was placed into a form and pressed onto a polyester film resulting in a film having a thickness of 0.112 inch.

To each plate was applied a very thin coating of wax on the side opposite the polyester support sheet in order to facilitate ready release after back exposure.

All plates were exposed to ultraviolet light radiation through the polyester support sheet using u.v. lamps, 2 inches apart, plate surfaces 2 inch from the lamps using the following lamp intensities: Run Nos. 1–4: 15 microwatts/cm$^2$×500. Thereafter, a negative having three identical percentage calibrated screen tints was placed in contact with the wax coated surface, and the plates were exposed for 8 minutes to u.v. light through the negative. After exposure, the negatives were removed and the plates were washed for 5 minutes in a rotary brush processor using a tetrachlorethylene (75%)-n-butanol (25%) mixture.

Commercially acceptable 10 second Durometer hardness values (Shore A values determined after 10 second plunger contact with material) for soft flexographic photopolymer printing plates lie in the range of from about 10 to 45, preferably from about 15–40, most preferably from 18–35.

Hardness and relief measurements were taken with the following results:

| Run No. | 1 | 2 | 3 | 4 |
|---|---|---|---|---|
| Shore A hardness. | | | | |
| initial | 35 | 32 | 27 | 19 |
| after 10 sec. | 33 | 30 | 25 | 18 |
| Relief (mils) at back exposure Minutes | | | | |
| 0 | 47 | 53 | 58 | 65 |
| 1 | 40 | 45 | 48 | 45 |
| 2 | 9 | 17 | 20 | 38 |
| 3 | 4 | 0 | 7 | 23 |
| 4 | 3 | 0 | 2 | 8 |

The data clearly indicate the wide exposure flexibility of the compositions of this invention concomitant with exceptionally low hardness values. Resolution of 2 minute back exposed plates was excellent, i.e. 3% 105 line tone was well defined and overall quality was good.

EXAMPLE 2

Following essentially the procedure of Example 1, a photosensitive composition was prepared using the following recipe:

| Run No. | 5 |
|---|---|
| HMWP (1) | 80 |
| LMWP (2) | 20 |
| HDDA (3) | 5 |
| HDDM (3) | 3.3 |
| DMPA (3) | 1.7 |
| Processing aids (3) | 6.0 |
| Antioxidant (3) | 0.06 |

Remarks
(1) As in Example 1.
(2) Polybutadiene; $\bar{M}w = 3000$; vinyl content = 80%
(3) See Example 1.

The resultant blend had Shore A hardness of 26. Plates, prepared as described in Example 1, exhibit characteristics similar to those of Runs No. 1–4.

EXAMPLE 3

For comparison purposes, the high molecular weight elastomer of Example 1 was blended with certain carboxyl group containing low molecular polymers following the Example 1 procedure (Run No. A and B are outside the invention):

| Run No. | A | B |
|---|---|---|
| HMWP (1) | 80 | 80 |
| LMWP-A (2) | 20 | — |
| LMWP-B (3) | — | 20 |

Remarks
(1) As in Example 1.
(2) Polybutadiene; Mn = 4000; COOH content = 2.01%
(3) Poly(butadiene(90%)-acrylonitrile(10%)); Mn = 3400; COOH content = 1.85% (all by weight)

The resultant blends exhibited considerable opacity and reduced flexibility, i.e., a cheesy consistency indicating that such polymer combinations are incompatible and not acceptable for making flexographic printing plates therefrom.

Thus, the instant invention provides clear, solid, soft photosensitive compositions which, when formed into flexible printing plates and developed, are of sufficiently low Durometers, i.e., Shore A hardness values, that they print very evenly, i.e., they realize uniform ink laydown, even under conditions of large plate pressure variations such as those inherent when printing on corrugated surfaces. Heretofore, no commercially satisfactory solid photosensitive compositions have achieved the clarity, flexibility and "softness" of the instant compositions especially those preferred compositions of this invention that have 10 second Shore A values in the range from about 18–35.

Although the invention has been illustrated by the preceding examples, it is not to be construed as being limited to the materials employed therein, but rather, the invention encompasses the generic area as hereinbefore disclosed. Various modifications and embodiments can be made without departing from the spirit and scope thereof.

What is claimed is:

1. A photosensitive elastomeric composition which comprises:
   (A) a thermoplastic elastomeric block copolymer having the structure AB or ABA whereby A represents polystyrene sequences and B represents polyisoprene sequences having a number average molecular weight (Mn) of about 30,000 to 125,000, and a Mooney viscosity (ML-4 at 100° C.) of 35 or higher;
   (B) a low molecular weight diene homopolymer having a number average molecular weight of about 1,000 to 25,000;
   (C) a photopolymerizable, ethylenically unsaturated cross-linking agent compatible with polymers (A) and (B) in an amount of between 2 and 40 parts based on 100 parts (A) and (B); and
   (D) an addition polymerization initiator activatible by actinic radiation in an amount of between 0.01 and 10 parts based on 100 parts of (A) and (B);
   wherein the weight ratio of polymer (A) to polymer (B) is from about 95: to 50:50.

2. The elastomeric composition of claim 1 wherein the weight ratio of polymer A to polymer B is from about 95:5 to 50:50.

3. The elastomeric composition of claim 1 wherein: polymer A has a number average molecular weight of from about 30,000 to 100,000 with a Mooney viscosity (ML-4 at 100° C.) of from about 35 to 60; and
   polymer B has a number average molecular weight of from about 5,000 to 25,000.

4. The elastomeric composition of claim 1 wherein: polymer A has a number average molecular weight of from about 35,000 to 75,000 with a Mooney viscosity (ML-4 at 100° C.) of from about 35 to 60; and
   polymer B has a number average molecular weight of from about 8,000 to 20,000.

5. A photosensitive elastomeric composition which comprises:
   (A) thermoplastic elastomeric block copolymer having the structure AB or ABA whereby A represents polystyrene sequences and B represents polyisoprene sequences having a number average molecular weight of from about 35,000 to 75,000, and an Mooney viscosity (ML-4 at 100° C.) of from about 35 to 60;
   (B) a low molecular weight diene homopolymer having a number average molecular weight of from about 8,000 to 20,000;

(C) a photopolymerizable, ethylenically unsaturated cross-linking agent compatible with polymers (A) and (B) in an amount of between 2 and 40 parts based on 100 parts (A) and (B); and (D) an addition polymerization initiator activatible by actinic radiation in amount of between 0.01 and 10 parts based on 100 parts of (A) and (B);

wherein the weight ratio of polymer (A) to polymer (B) is from about 85:15 to 75:25.

6. A photosensitive flexographic plate which comprises a substrate having thereon a layer of the photosensitive composition of claim 1.

7. A photosensitive flexographic plate which comprises a substrate having thereon a layer of the photosensitive composition of claim 5.

* * * * *